United States Patent
Peythieux et al.

(10) Patent No.: US 11,385,783 B2
(45) Date of Patent: Jul. 12, 2022

(54) GESTURE-BASED MANIPULATOR FOR ROTATION

(71) Applicant: Dassault Systemes, Velizy Villacoublay (FR)

(72) Inventors: Laura Peythieux, Aix en Provence (FR); Frederic Letzelter, Longjumeau (FR)

(73) Assignee: Dassault Systemes, Velizy Villacoublay (FR)

( * ) Notice: Subject to any disclaimer, the term of this patent is extended or adjusted under 35 U.S.C. 154(b) by 2 days.

(21) Appl. No.: 16/222,530

(22) Filed: Dec. 17, 2018

(65) Prior Publication Data

US 2019/0196699 A1 Jun. 27, 2019

(30) Foreign Application Priority Data

Dec. 22, 2017 (EP) .................................... 17306922

(51) Int. Cl.
*G06F 3/04845* (2022.01)
*G06T 19/20* (2011.01)
(Continued)

(52) U.S. Cl.
CPC ...... *G06F 3/04845* (2013.01); *G06F 3/04815* (2013.01); *G06F 30/00* (2020.01);
(Continued)

(58) Field of Classification Search
CPC .. G06F 3/04845; G06F 30/00; G06F 3/04815; G06F 2203/04804;
(Continued)

(56) References Cited

U.S. PATENT DOCUMENTS 6,077,307 A  *  6/2000  Benzel .................. G06F 30/398
                                                716/52
7,574,628 B2 *  8/2009  Qassoudi .............. G06F 3/0481
                                                345/163
(Continued)

OTHER PUBLICATIONS

GoEngineer, "Solidworks Quick Tip—Move with Triad", Sep. 15, 2015, YouTube, <URL: https://www.youtube.com/watch?v=OHVyb3fmG9I>, retrieved Apr. 13, 2020 (Year: 2015).*
(Continued)

*Primary Examiner* — Christopher J Fibbi
(74) *Attorney, Agent, or Firm* — Hamilton, Brook, Smith & Reynolds, P.C.

(57) ABSTRACT

A computer-implemented method manipulates a 3D object in a 3D scene of a computer-aided design system, by: (i) displaying a 3D object having a center of rotation in the 3D scene on a screen; (ii) displaying in the 3D scene a rotation manipulator (RM) having three areas (RA1, RA2, RA3) perpendicular to each other, and each area (RA1, RA2, RA3) corresponding to a rotation plane, and (iii) activating the rotation manipulator. The rotation manipulator (RM) follows the cursor (C) on the screen. The rotation manipulator is activated by locking its location on the screen on an initial press point (PP). One rotation plane is selected by displacing the cursor (C) to the area (RA1, RA2, RA3) corresponding to said plane. A rotation manipulation is performed according to the displacement of the cursor (C) on the screen.

12 Claims, 7 Drawing Sheets

(51) Int. Cl.
*G06F 3/04815* (2022.01)
*G06F 30/00* (2020.01)
*G06T 19/00* (2011.01)
G06F 3/0354 (2013.01)
*G06F 3/04842* (2022.01)
*G06F 3/04883* (2022.01)

(52) U.S. Cl.
CPC .......... *G06T 19/003* (2013.01); *G06T 19/20* (2013.01); *G06F 3/03543* (2013.01); *G06F 3/04842* (2013.01); *G06F 3/04883* (2013.01); *G06F 2203/04804* (2013.01); *G06T 2200/24* (2013.01); *G06T 2219/2016* (2013.01)

(58) Field of Classification Search
CPC .......... G06F 3/04883; G06F 3/04842; G06F 3/03543; G06T 19/20; G06T 2219/2016; G06T 2200/24; G06T 19/003
See application file for complete search history.

(56) References Cited

U.S. PATENT DOCUMENTS

| | | | |
|---|---|---|---|
| 2005/0057579 A1 | 3/2005 | Young | |
| 2008/0034289 A1* | 2/2008 | Doepke | G06F 3/04855 715/700 |
| 2008/0238916 A1* | 10/2008 | Ghosh | G06T 19/00 345/419 |
| 2009/0313565 A1* | 12/2009 | Kohei | G06F 3/0481 715/765 |
| 2010/0060588 A1* | 3/2010 | Fong | G06F 3/04883 345/173 |
| 2013/0257777 A1* | 10/2013 | Benko | G06F 3/0346 345/173 |
| 2013/0293505 A1* | 11/2013 | Krishnamurthy | G06F 3/0488 345/173 |
| 2014/0104266 A1* | 4/2014 | Stone | G06F 30/00 345/419 |
| 2018/0082475 A1* | 3/2018 | Sharma | G06F 3/147 |

OTHER PUBLICATIONS

GoEngineer, "Solidworks Quick Tip—Move with Triad", Sep. 15, 2015, YouTube, <URL: https://www.youtube.com/watch?v=OHVyb3fmG9I>, retrieved Oct. 21, 2020 (Year: 2015).*

Glombik, Phillip, "Photoshop Quick Tip: How to Rotate a Selection or an Image", May 1, 2016, YouTube, <URL: https://www.youtube.com/watch?v=lekVmNawVuQ>, retrieved Mar. 24, 2022 (Year: 2016).*

Mufasu CAD, "Solidworks How to Rotate Park," YouTube, retrieved from the Internet: URL: https://www.youtube.com/watch?v=nEByRk9tpuU&feature=youtu.be (retrieved on May 14, 2018), p. 1 pp., XP054978347, Jan. 10, 2017.

Ksyniuk, "Blender Basics 5. Manipulators," YouTube, Retrieved from the Internet: URL: https://www.youtube.com/watch?v=Kpr0Ki70Y18 (retrieved on May 14, 2018), p. 2 pp., XP054478342, Jan. 31, 2011.

Solidworks, "What's New Solidworks 2016," retrieved from the Internet: URL: https://files.solidworks.com/supportfiles/whats_new/2016/English/whatsnew.pdf (retrieved on May 9, 2018), pp. 1-231, XP055474141, Jan. 1, 2016.

European Search Report for International Application No. 17306922.0, entitled "Gesture-Based Manipulator for Rotation," consisting of 8 pages, dated May 15, 2018.

* cited by examiner

GESTURE-BASED MANIPULATOR FOR ROTATION

RELATED APPLICATION(S)

This application claims priority under 35 U.S.C. § 119 or 365 to Europe, Application No. 17306922.0, filed Dec. 22, 2017. The entire teachings of the above application(s) are incorporated herein by reference.

FIELD OF THE INVENTION

The invention relates to a computer-implemented method for manipulating objects in a three-dimensional scene displayed on a computer display. It pertains to the fields of computer graphics, Authoring, Computer Aided Design (CAD), Computer Aided Engineering (CAE) and Computer Aided Manufacturing (CAM), and applies to all the situations wherein a digitally-modeled object has to be manipulated within a three-dimensional scene.

BACKGROUND

CAD applications, such as the one provided by Dassault Systèmes under the trademark Catia, allow a user to construct and manipulate complex three dimensional or 3D models of objects or assemblies of objects. When using CAD applications, it is often desirable to transform (e.g. rotate, translate) an object, or a sub-element of the object. It is known, in CAD applications, to use a graphical manipulator having three axis and representing the different 3D transformations available through its manipulation. The graphical manipulator can be represented in the scene of an object display window in the form of a multifaceted tool, wherein each facet of the tool can represent a different functionality (for example rotation, translation). The tool embodies a compact representation of multiple functionalities which can be associated on an object on which the functionality will be exercised. Each functionality of the tool is designed to effect a change on one or more objects of the scene in which the tool has been immersed.

SUMMARY

The invention relates more specifically to the rotation functionality of the tool, which is called rotation manipulator.

FIGS. 1 to 3 depict a rotation manipulation according to a first solution of the background art. The immersion of the rotation manipulator RM in the scene allows the rotation manipulator RM to behave like other objects of the scene in many respects. For example, as the view of the scene is changed through rotation movement of the view, the view of the rotation manipulator RM immersed in the scene will change accordingly. More details about the rotation manipulator RM, and more generally about the aforementioned multifaceted tool, can be found in document U.S. Pat. No. 7,823,085 B2. FIG. 1 illustrates the rotation manipulator RM, comprising a center CE, three axis X, Y and Z, and three rotation planes defined by three arcs XY, YZ and ZX for a rotation respectively around the Z axis, around the X axis and around the Y axis. The rotation manipulator RM is usually positioned and fixed at the center of gravity of the object OB to rotate. For the sake of clarity, on FIG. 2, the rotation manipulator RM has been displayed on an edge ED. In FIG. 3, the user moves the cursor C over the rotation manipulator RM to select the desired rotation (arc XY for a rotation around the Z axis, arc YZ for a rotation around the X axis and arc ZX for a rotation around the Y axis), and finally presses the mouse and hold it (i.e. does not release) while moving the cursor. The movement of the cursor causes the object to rotate in the direction specified by the arc, and by an angle determined as a function of the displacement of the cursor. This solution of background art contains several limitations, all linked to the fact that the rotation manipulator is fixed on a 3D point inside the scene. The cursor has indeed to be just near or on the object OB to rotate. Therefore, if the cursor is in another part of the scene just before the rotation manipulation for another interaction, the user has to move the cursor back to the rotation manipulator RM in order to rotate the object OB. This can lead to a lot of cursor displacement. The rotation manipulation, due to the proximity of the cursor to the object OB, may also force the user to position the cursor on the object OB, hiding it partially or even completely. It is all the more troublesome in touch mode, since the hand of the user blocks a correct visualization of the object OB, thereby making the rotation hard to control.

FIGS. 4 and 5 depict a rotation manipulation in a scene according to a second solution of the background art. In this solution, the user can perform a rotation from everywhere in the scene, not necessarily close to the object OB, thereby avoiding the hiding of the object OB by the cursor or by the finger of the user in touch mode. FIG. 4 illustrates a scene of this second solution. The scene is divided into three rotation areas (RA1, RA2, RA3), the intersection of the three parts being the center 1 of the rotation manipulator RM. The selection of the rotation axis is determined by the position of the cursor in the scene (first rotation area RA1 for rotation around the Z axis, second rotation area RA2 for rotation around the X axis, and third rotation area RA3 for rotation around the Y axis). The user then performs the rotation manipulation around the selected rotation axis, as illustrated in FIG. 5. The cursor is moved from an initial point IP to a final point FP. This second solution of background art contains several limitations. Firstly, if the user wants to perform several rotation manipulations, he must explore the scene from part to part to find the desired rotation area, which implies a lot of mouse displacement to reach the desired rotation area. Secondly, the user must have a constant look to the object OB on one side of the scene, while moving the cursor C on the other side of the scene, which can be uncomfortable for him. Another limitation stems from the impossibility to perform a rotation manipulation if the rotation manipulator RM is not visible, for example if the user has zoomed in, or translated the point of view. A lot of cursor displacement is finally made to rotate the object OB from the initial point IP to the final point FP.

A goal of the invention is then to provide a computer-implemented method for manipulating a 3D object in a 3D scene of a system of computer-aided design, which reduces the cursor displacement throughout the different steps of the manipulation, which avoids any obstruction of the object to manipulate, and which offers a visual comfort to the user.

It is proposed, according to one aspect of the invention, a computer-implemented method for manipulating a 3D object in a 3D scene of a computer-aided design system, the method comprising the steps of:

a) displaying a 3D object having a center of rotation in the 3D scene on a screen;

b) displaying in the 3D scene a rotation manipulator having three areas perpendicular to each other, the rotation manipulator following the cursor on the screen, each area corresponding to a rotation plane;

c) activating the rotation manipulator by locking its location on the screen on an initial press point;

d) selecting one rotation plane by displacing the cursor to the area corresponding to said plane; and e) performing a rotation manipulation according to the displacement of the cursor on the screen.

According to particular embodiments of the invention:

steps d) and e) may be performed in response to a maintained user input controlling the cursor during the displacement of the cursor;

step d) may comprise the sub-steps of:
  d1) directing the cursor to the area; and
  d2) determining whether the cursor reaches a validation threshold specific to the area.

the validation threshold may be defined by a curve portion, each point of said curve portion having a predefined pixel distance relative to the press point.

the curve portion may be the external contour of the corresponding area.

sub-step d1) of directing the cursor may comprise the provision of a visual feedback of the area where the cursor is located.

sub-step d1) of directing the cursor may comprise the provision of a visual feedback of the areas where the cursor is not located.

step d) of selecting one rotation plane may comprise a sub-step d3) of providing a visual feedback of the exceeding of the validation threshold for the corresponding area.

the visual feedback may be a change of the size and/or color and/or level of transparency of the area.

step e) may comprises the sub-steps of:
  e1) determining a reference vector, whose direction is defined by the initial press point and by a validation point, said validation point corresponding to the position of the cursor when it reaches the validation threshold;
  e2) determining a current vector, whose direction is defined by the initial press point and by a current point, said current point corresponding to the position of the cursor once it has reached the validation threshold;
  e3) performing the rotation manipulation according to the angle between the reference vector and the current vector.

Another object of the invention is a computer program product, stored on a non-transitory computer-readable data-storage medium, comprising computer-executable instructions to cause a computer system to carry out a method as defined above.

Another object of the invention is a non-transitory computer-readable data-storage medium containing computer-executable instructions to cause a computer system to carry out a method as defined above.

Another object of the invention is a computer system comprising a processor coupled to a memory and a graphical user interface, the memory storing computer-executable instructions to cause the computer system to carry out a method as defined above.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

The invention will be better understood with the help of some embodiments described by way of non-limiting examples and illustrated by the accompanying drawings wherein.

DETAILED DESCRIPTION

A description of example embodiments follows.

Hereafter, a "three-dimensional" (or "3D") object will be the digital representation, in a computer system, of a physical object allowing a three-dimensional (3D) graphical representation. A 3D representation allows the viewing of the part from all angles. For example, a 3D object, when 3D represented, may be handled and turned around any of its axes, or around any axis in the screen on which the representation is displayed.

A "three-dimensional" (or "3D") scene is a virtual environment, which is constituted by a plurality of 3D objects disposed in a three-dimensional space.

Hereafter, a "selection context" refers to the handling of a 3D object (or a plurality of 3D objects) which has been previously selected. This implies that the 3D object can be displayed on the screen, the press button of the mouse being released before the beginning of the rotation manipulation.

Hereafter, the "touch mode" refers to the control of the cursor on a touch-sensitive surface, be it a touch pad which is separated from the screen, or a touch screen, which includes the touch pad and the display functionalities. The user input can be provided through maintaining his finger, or a stylus, on the touch-sensitive surface.

Figure 1:
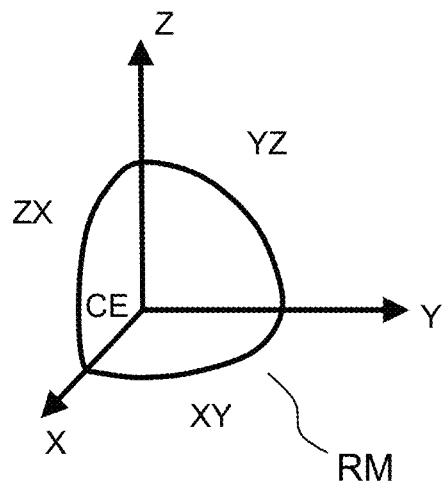
FIGS. 1 to 5 illustrate examples of scenes of rotation manipulation according to the state of the art.
Figure 2:
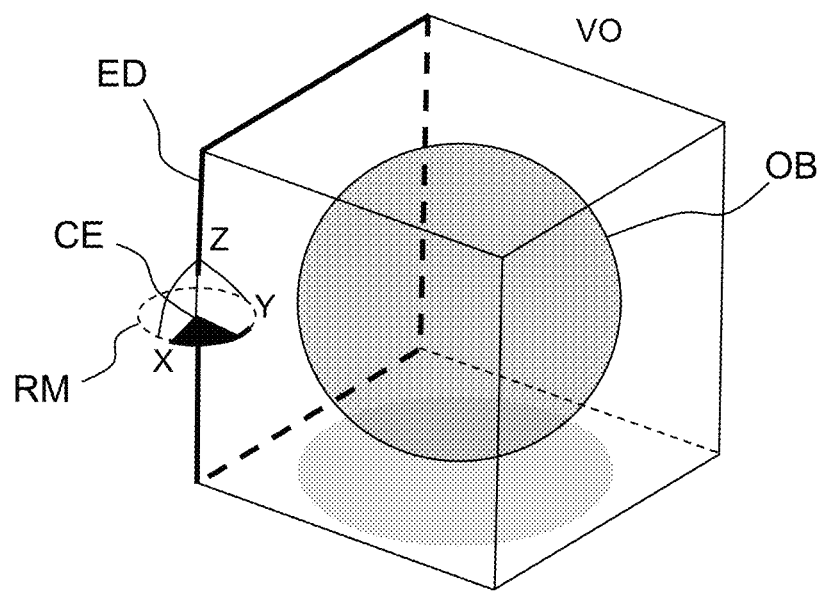
Figure 3:
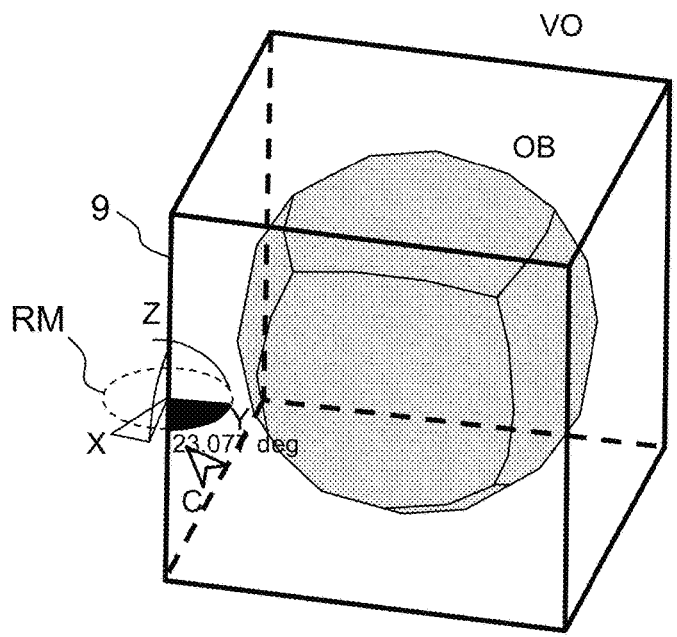
Figure 4:
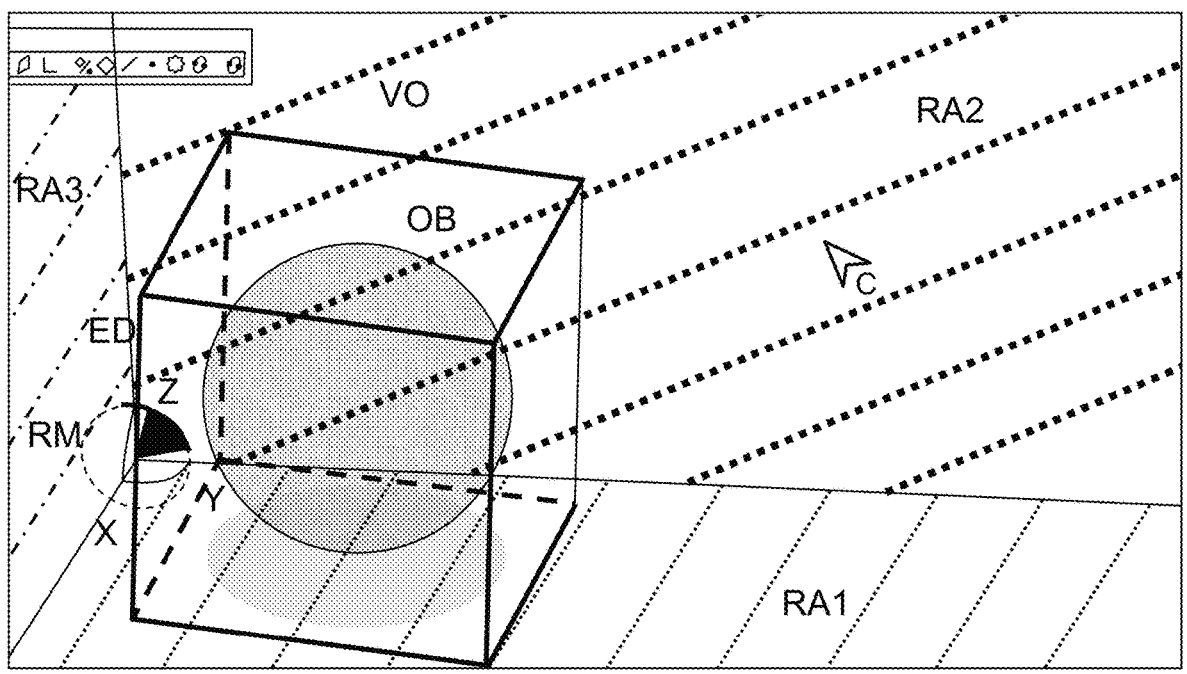
Figure 5:
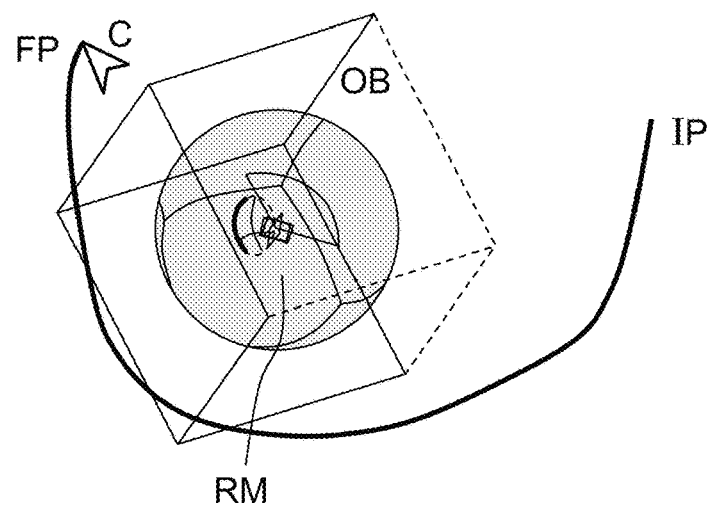
Figure 6:
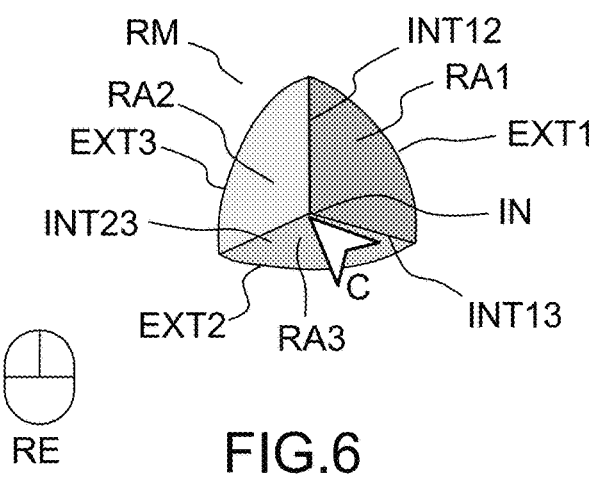
FIGS. 6 to 11 illustrate an example of rotation manipulator according to the invention, with the associated state of the pointing device.

FIG. 6 shows a rotation manipulator RM at initial state. It is composed of three areas (RA1, RA2, RA3), which can have different colours, so as to distinguish each area from another. Each area comprises an external contour (EXT1, EXT2, EXT3) and two internal contours (INT12, INT13, INT23). Each internal contour is a segment and represents a rotation axis for the object to be manipulated. Each external contour can be an arc, a curved section, a segment, or can have any other shape. The three internal contours come across at an intersection point IN. The cursor, which echoes the movement of the pointing device of the user, can be represented as an arrow. The extremity of the arrow is located at the intersection point IN. The invention has to be considered in a selection context. Therefore, whenever the cursor is located in the 3D scene, the rotation manipulator RM can be attached to the cursor, thereby following it. FIG. 5 also shows the state of the pointing device before the triggering of the rotation manipulation. When the rotation manipulator is dragged in the 3D scene thanks to the pointing device, no user input is required. If the pointing device is a mouse, the user can move it without pressing on the mouse, therefore the pointing device is in "release state" RE. In touch mode, since there is no distinction between the contact of the finger (or stylus) for dragging and the contact of the finger for selecting, the displacement of the finger yields the dragging of the rotation manipulator RM with the cursor, without any triggering of the rotation manipulation.

Figure 7:
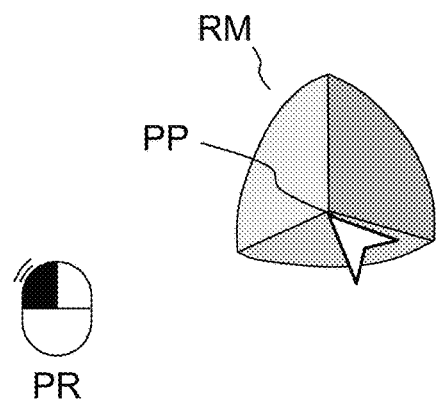

FIG. 7 shows the rotation manipulator RM when a user input, such as a mouse press PR, is received. At the detection of the mouse press, the rotation manipulator RM is activated, and its location is locked until the end of the rotation manipulation. The intersection point IN, at which the cursor C is pointing, is then considered as the initial press point PP. In touch mode, the user may drag the rotation manipulator RM in the 3D scene, then release the contact on the screen and touch a button on the screen so as to lock the location of the rotation manipulator.

Figure 8:
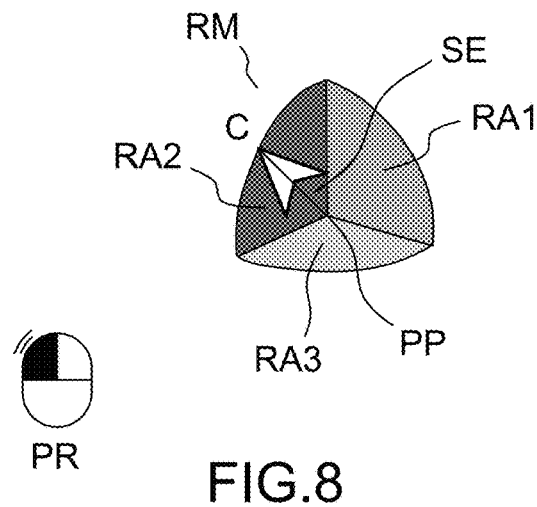

FIG. 8 shows the rotation manipulator RM after its activation. Once the location of the rotation manipulator RM has been locked, the displacement of the mouse yields the dragging of the cursor with respect to the fixed rotation manipulator RM. The user can direct the cursor to one of the areas (RA1, RA2, RA3) while still pressing on the mouse. In touch mode, the user may direct the cursor to one of the areas (RA1, RA2, RA3) while contacting his finger on the sensitive screen and/or on the touchpad. The area where the cursor is currently located may be highlighted through a visual feedback, so that the user visualizes clearly which rotation plane will be selected if he validates the highlighted rotation plane. The visual feedback can be, for example, a rise of the level of transparency of the areas where the cursor is not located (areas RA1 and RA3 in FIG. 8), and/or a change of colour of the area where the cursor is located (area RA2 in FIG. 8). The course of the cursor in the area can be masked. Alternatively, a segment SE, delimitated by the initial press point PP and by the position of the cursor, can be displayed. The orientation of the segment and its length may then vary, in function of the position of the cursor in the area.

Figure 9:
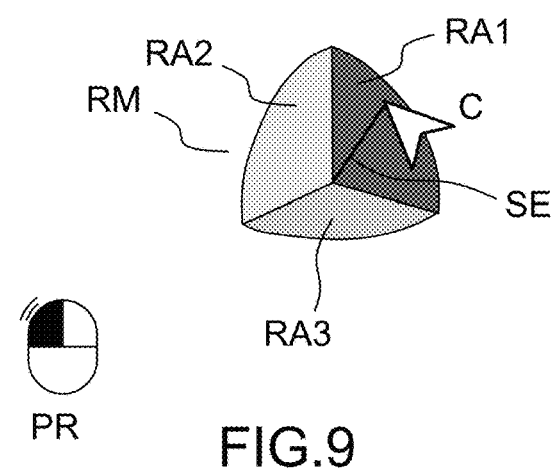

FIG. 9 shows an alternative location of the cursor in the rotation manipulator RM. The user may indeed drag the cursor, still while pressing the mouse or contacting the touch screen, and switch to another area, for example to area RA1. Accordingly, the visual feedback of the areas may change if the user switches from one area to another, as long as the rotation plane has not been selected.

Figure 10:
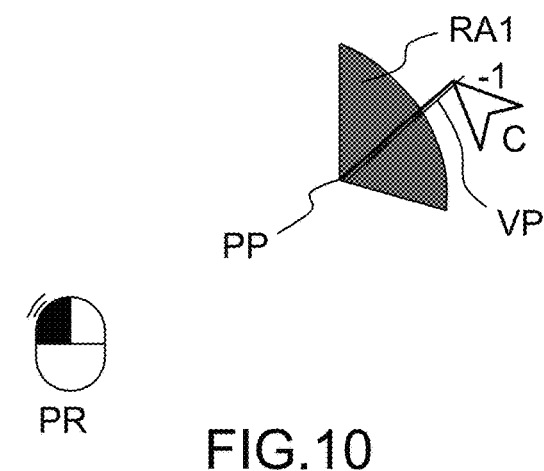

FIG. 10 shows the selection of a rotation plane. According to a first embodiment, if the cursor reaches a validation threshold defined by a curve portion, a validation point VP is generated on the rotation manipulator RM. Each point of the curve portion has a predefined pixel distance relative to the press point PP. The pixel distance may be expressed in pixels or in length unit, such as millimetres. The validation point VP corresponds to the position of the cursor when it reaches the curve portion corresponding to an area. The reach of the curve portion of an area therefore activates the rotation manipulation. The rotation is made around the axis which is orthogonal, in three dimensions, to the rotation plane corresponding to the curve portion. According to an embodiment, each curve portion is the external contour of its corresponding area (respectively EXT1, EXT2 and EXT3 for areas RA1, RA2 and RA3). Alternatively, each curve portion may be defined by the contour of a circle of a predefined radius and whose center is the initial press point PP. The predefined radius may be expressed in pixels or in length unit, such as millimetres. The circle may be displayed once the rotation manipulator RM has been activated. It can be masked after the validation threshold has been reached. The circle may be split into three arcs, each arc corresponding to a rotation plane. Whenever the cursor reaches one of the arcs of the circle, the rotation plane corresponding to the arc is selected.

Figure 11:
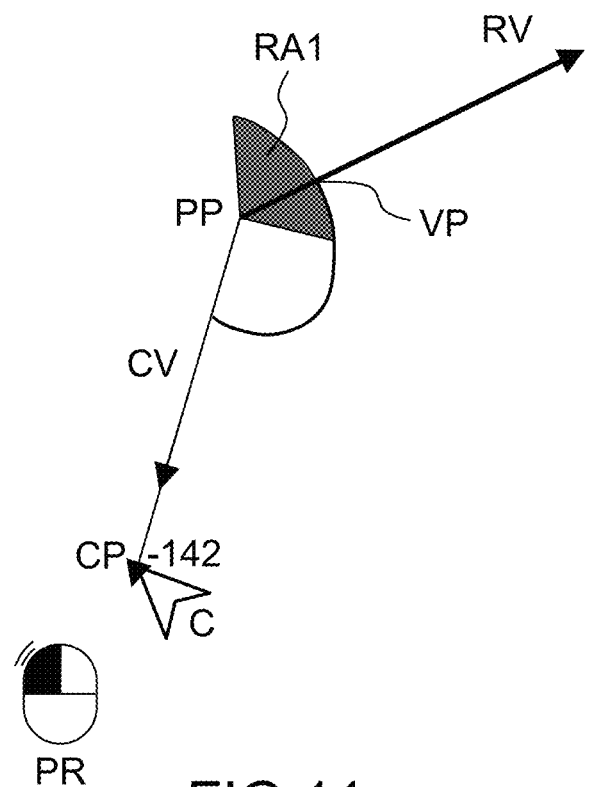

FIG. 11 shows the rotation manipulator RM during the rotation manipulation, once the rotation plane has been activated. A reference vector RV is generated and may be displayed. The origin of the reference vector RV is the initial press point PP. The reference vector RV is constructed so as to go through the validation point PV. The norm of the reference vector RV is arbitrary. It can be, for example, the distance between the initial press point PP and the validation point PV, or a predetermined distance. Once the rotation plane has been activated, a current point CP is displayed, which corresponds to the position of the cursor. The current point CP is then dragged in the 3D scene, the user still maintaining an input (mouse pressing or finger contacting in touch mode). A current vector CV, whose origin is the initial press point PP, is generated. Its norm is the distance between the initial press point PP and the current point CP. The rotation angle is derived from the angle between reference vector RV and the current vector CV. A numerical value of the rotation angle may be provided as soon as the rotation manipulation has been activated. The numerical value of the rotation angle can be preceded by a negative sign if the 3D object is rotated clockwise. The rotation angle may be defined in degrees or in radians. For example, the rotation angle may be located close to the current point CP. According to an embodiment, the rotation of the 3D object can be stopped after a 360° rotation, even if the user keeps on dragging the cursor. Therefore, the user is prevented from performing several complete rotations. It thereby avoids the cumbersome operation of returning to a former position of the 3D object after several complete rotations.

The rotation manipulation of the 3D object around its center of gravity may be performed according to the rotation angle. According to a first embodiment, the rotation of the 3D object can be executed on the fly, during the dragging of the cursor. Alternatively, the rotation can be executed according to one angle, at the end of the rotation manipulation, once the user has released the press button (or released the contact in touch mode). The user can drag the cursor so as to modify the norm of the current vector CV, thus generating a leverage effect. Consequently, the farther the cursor is from the initial press point, the more accurate the user is to control the rotation angle.

Once the user has released the press button of the mouse, or once there is no more contact between the finger and the touch screen, the rotation manipulator RM comes back at initial state, as depicted in FIG. 6.

Figure 12:
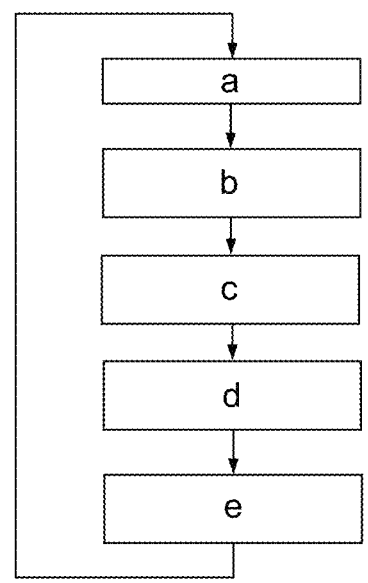
FIGS. 12 and 13 illustrate the different steps of a method according to the invention.

FIG. 12 is a flow chart of a method according to an embodiment of the invention, whose steps correspond to the operations already discussed in relation to FIGS. 6-11. In the flow chart of FIG. 12:

Step a) consists in displaying a 3D object having a center of rotation in the 3D scene on a screen.

Step b) consists in displaying in the 3D scene a rotation manipulator RM having three areas RA1, RA2, RA3 perpendicular to each other, the rotation manipulator RM following the cursor C on the screen, each area RA1, RA2, RA3 corresponding to a rotation plane.

Step c) is the activation of the rotation manipulator by locking its location on the screen on an initial press point PP.

Step d) is the selection of one rotation plane by displacing the cursor C to the area RA1, RA2, RA3 corresponding to said plane.

Step e) consists in performing a rotation manipulation according to the displacement of the cursor C on the screen.

Figure 13:
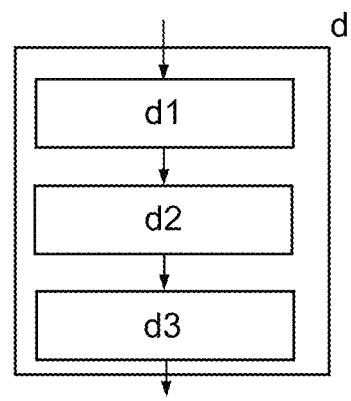

FIG. 13 is a flow chart of the step of selection of one rotation plane. In the flow chart of FIG. 13:

Step d1) consists in directing the cursor C to the area RA1, RA2, RA3;

Step d2) consists in determining whether the cursor C reaches a validation threshold specific to the area A1, A2, A3.

Step d3) is the provision of a visual feedback of the exceeding of the validation threshold for the corresponding area.

The inventive method optimizes the displacement of the mouse or of the finger, through the performing of a rotation from anywhere in the 3D scene. It also prevents the user from hiding the object he rotates. It finally decreases the mouse or (finger) displacement necessary to control the rotation angle and allows at playing on the accuracy.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 14:
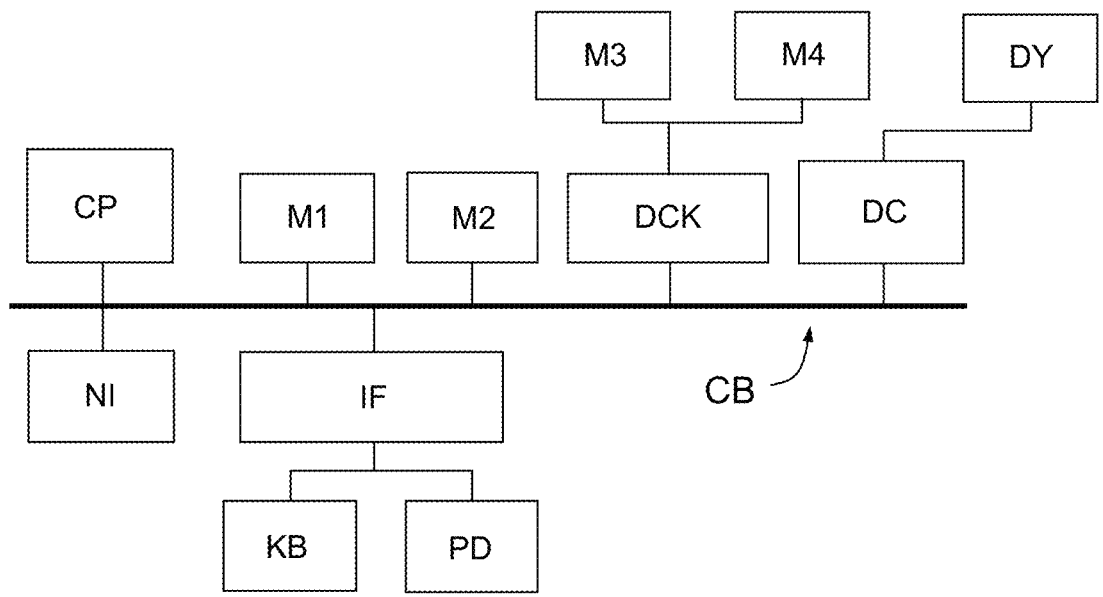
FIGS. 14 and 15 illustrate block diagrams of respective computer systems suitable for carrying out a method according to different embodiments of the invention.

A computer suitable for carrying out a method according to an exemplary embodiment of the present invention is described with reference to FIG. 14. In FIG. 14, the computer includes a Central Processing Unit (CPU) P which performs the method step described above while running an executable program, i.e. a set of computer-readable instructions, stored in a memory device such as RAM M1 or ROM M2 or hard disk drive (HDD) M3, DVD/CD drive M4, or stored remotely. Moreover, one or more computer files defining the three-dimensional object may also be stored on one or more of memory devices M1 to M4, or remotely.

The claimed invention is not limited by the form of the computer-readable media on which the computer-readable instructions of the inventive process are stored. For example, the instructions and files can be stored on CDs, DVDs, in FLASH memory, RAM, ROM, PROM, EPROM, EEPROM, hard disk or any other information processing device with which the computer communicates, such as a server or computer. The program can be stored on a same memory device or on different memory devices.

Further, a computer program suitable for carrying out the inventive method can be provided as a utility application, background daemon, or component of an operating system, or combination thereof, executing in conjunction with CPU P and an operating system such as Microsoft VISTA, Microsoft Windows 8, UNIX, Solaris, LINUX, Apple MAC-OS and other systems known to those skilled in the art.

CPU P can be a Xeon processor from Intel of America or an Opteron processor from AMD of America, or can be other processor types, such as a Freescale ColdFire, IMX, or ARM processor from Freescale Corporation of America. Alternatively, the CPU can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The computer in FIG. 14 also includes a network interface NI, such as an Intel Ethernet PRO network interface card from Intel Corporation of America, for interfacing with a network, such as a local area network (LAN), wide area network (WAN), the Internet and the like. The computer further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard, the sensitive surface for the touch mode and the pointing device, together with the display controller and the I/O interfaces, form a graphical user interface, used by the user to provide input commands—e.g. to move the pointer—and by the computer for displaying the three-dimensional scene and the graphical tool.

Disk controller DKC connects HDD M3 and DVD/CD M4 with communication bus CBS, which can be an ISA, EISA, VESA, PCI, or similar, for interconnecting all of the components of the computer.

A description of the general features and functionality of the display, keyboard, pointing device, as well as the display controller, disk controller, network interface and I/O interface is omitted herein for brevity as these features are known.

Figure 15:
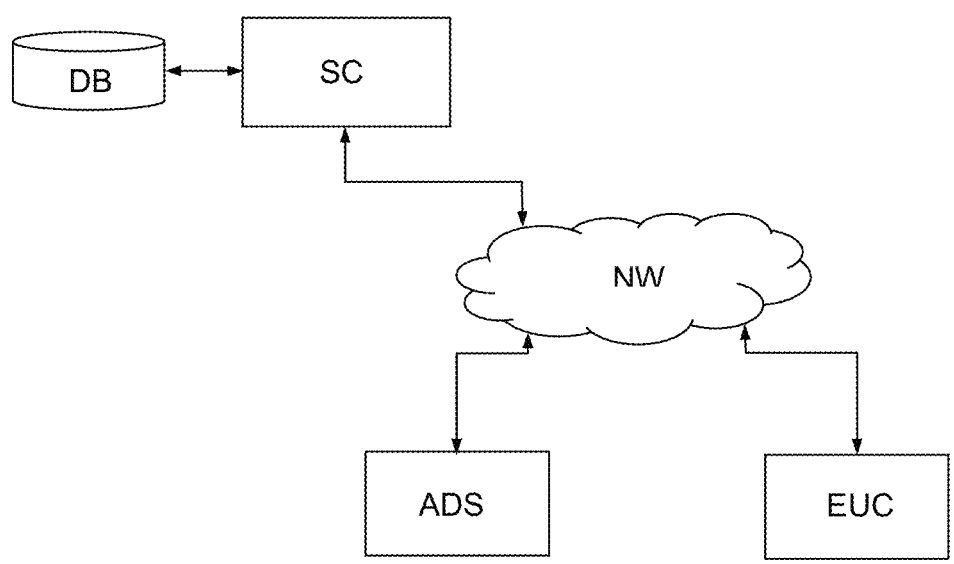

FIG. 15 is a block diagram of a computer system suitable for carrying out a method according to a different exemplary embodiment of the present invention.

In FIG. 15, the executable program EXP and the computer files defining the three-dimensional object are stored on memory devices connected to a server SC. The memory devices and the overall architecture of the server may be the same as discussed above with reference to FIG. 14, except that display controller, sensitive surface, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 14, except that the memory devices of the administrator system and the end user computer do not store the executable program EXP and/or the computer files defining the three-dimensional object. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses, via the network NW, a database DB stored by the server SC and containing files defining three-dimensional object. The server performs the processing as described above, and transmits to the end user computer an image file corresponding to the desired representation of the scene including the 3D object, again using the network NW.

Although only one administrator system ADS and one end user system EUX are shown, the system can support any number of administrator systems and/or end user systems without limitation. Similarly, multiple servers can also be implemented in the system without departing from the scope of the present invention Any method steps described herein should be understood as representing modules, segments, or portions of code which include one or more executable instructions for implementing specific logical functions or steps in the process, and alternate implementations are included within the scope of the exemplary embodiment of the present invention.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A computer-implemented method for manipulating a 3D object in a 3D scene of a computer-aided design system, the method comprising the steps of:
   a) displaying a 3D object having a center of rotation in the 3D scene on a screen;
   b) displaying in the 3D scene a rotation manipulator (RM) having three areas (RA1, RA2, RA3) perpendicular to each other, the rotation manipulator (RM) following a cursor (C) on the screen, each area (RA1, RA2, RA3) corresponding to a rotation plane;
   c) activating the rotation manipulator by locking its location on the screen on an initial press point (PP), said locking comprising:
      locking the rotation manipulator on the screen at a current position of the cursor (C) upon depression of a mouse button by the user;
   while the user maintains the depression of the mouse button:
      d) selecting one rotation plane by performing a displacement of the cursor (C) to the area (RA1, RA2, RA3) corresponding to said plane; and
      e) performing a rotation manipulation of the 3D object by a determined angle within the selected rotation plane according to the displacement of the cursor (C) on the screen away from the initial press point (PP),
   the method returning to step a) and unlocking the rotation manipulator once the user releases the mouse button.

2. The method according to claim 1, wherein step d) comprises the sub-steps of:
   d1) directing the cursor (C) to the area (RA1, RA2, RA3); and
   d2) determining whether the cursor (C) reaches a validation threshold specific to the area (A1, A2, A3).

3. The method according to claim 2, wherein the validation threshold is defined by a curve portion, each point of said curve portion having a predefined pixel distance relative to the press point (PP).

4. The method according to claim 3, wherein the curve portion is the external contour (EXT1, EXT2, EXT3) of the corresponding area (RA1, RA2, RA3).

5. The method according to claim 2, wherein sub-step d1) of directing the cursor includes providing a first type of visual feedback of the area where the cursor is located.

6. The method according to claim 5, wherein sub-step d1) of directing the cursor comprises providing a second type of visual feedback of the areas where the cursor is not located.

7. The method according to claim 6, wherein step d) of selecting one rotation plane comprises a sub-step d3) providing a third type of visual feedback of exceeding the validation threshold for the corresponding area.

8. The method according to claim 7, wherein visual feedback of any of the first, second and third types is a change of the size and/or color and/or level of transparency of the area.

9. The method according to claim 2, wherein step e) comprises the sub-steps of:
   e1) determining a reference vector (RV), whose direction is defined by the initial press point (PP) and by a validation point (VP), said validation point (VP) corresponding to the position of the cursor (C) when it reaches the validation threshold;
   e2) determining a current vector (CV), whose direction is defined by the initial press point (PP) and by a current point (CP), said current point (CP) corresponding to the position of the cursor (C) once it has reached the validation threshold;
   e3) performing the rotation manipulation according to the angle between the reference vector (RV) and the current vector (CV).

10. A computer program product, comprising:
   a non-transitory computer-readable data-storage medium (M1-M4), storing computer-executable instructions that cause a computer system to manipulate a 3D object in a 3D scene of computer aided design system;
   the computer-executable instructions including instructions for:
   a) displaying a 3D object having a center of rotation in the 3D scene on a screen;
   b) displaying in the 3D scene a rotation manipulator (RM) having three areas (RA1, RA2, RA3) perpendicular to each other, the rotation manipulator (RM) following a cursor (C) on the screen, each area (RA1, RA2, RA3) corresponding to a rotation plane;
   c) activating the rotation manipulator by locking its location on the screen on an initial press point (PP), said locking comprising:
      locking the rotation manipulator on the screen at a current position of the cursor (C) upon depression of a mouse button by the user;
   while the user maintains the depression of the mouse button:
      d) selecting one rotation plane by performing a displacement of the cursor (C) to the area (RA1, RA2, RA3) corresponding to said plane; and
      e) performing a rotation manipulation of the 3D object by a determined angle within the selected rotation plane according to the displacement of the cursor (C) on the screen away from the initial press point (PP).

11. A non-transitory computer-readable data-storage medium (M1-M4) comprising:
   a memory area; and
   computer-executable instructions (EXP) held in the memory area that cause a computer system to manipulate a 3D object in a 3D scene of a computer aided design system by:
   a) displaying a 3D object having a center of rotation in the 3D scene on a screen;
   b) displaying in the 3D scene a rotation manipulator (RM) having three areas (RA1, RA2, RA3) perpendicular to each other, the rotation manipulator (RM) following a cursor (C) on the screen, each area (RA1, RA2, RA3) corresponding to a rotation plane;
   c) activating the rotation manipulator by locking its location on the screen on an initial press point (PP), said locking comprising:

locking the rotation manipulator on the screen at a current position of the cursor (C) upon depression of a mouse button by the user;

while the user maintains the depression of the mouse button:

d) selecting one rotation plane by performing a displacement of the cursor (C) to the area (RA1, RA2, RA3) corresponding to said plane; and e) performing a rotation manipulation of the 3D object by a determined angle within the selected rotation plane according to the displacement of the cursor (C) on the screen away from the initial press point (PP).

12. A computer system comprising:

a processor (P) coupled to a memory (M1-M4) and a graphical user interface (KB, PD, DC, DY), the memory storing computer-executable instructions (EXP) that cause the computer system to manipulate a 3D object in a 3D scene of a computer aided design system by:

a) displaying a 3D object having a center of rotation in the 3D scene on a screen;

b) displaying in the 3D scene a rotation manipulator (RM) having three areas (RA1, RA2, RA3) perpendicular to each other, the rotation manipulator (RM) following a cursor (C) on the screen, each area (RA1, RA2, RA3) corresponding to a rotation plane;

c) activating the rotation manipulator by locking its location on the screen on an initial press point (PP), said locking comprising:

locking the rotation manipulator on the screen at a current position of the cursor (C) upon depression of a mouse button by the user;

while the user maintains the depression of the mouse button:

d) selecting one rotation plane by performing a displacement of the cursor (C) to the area (RA1, RA2, RA3) corresponding to said plane; and e) performing a rotation manipulation of the 3D object by a determined angle within the selected rotation plane according to the displacement of the cursor (C) on the screen away from the initial press point (PP).

* * * * *

UNITED STATES PATENT AND TRADEMARK OFFICE
CERTIFICATE OF CORRECTION

PATENT NO. : 11,385,783 B2
APPLICATION NO. : 16/222530
DATED : July 12, 2022
INVENTOR(S) : Laura Peythieux and Frederic Letzelter It is certified that error appears in the above-identified patent and that said Letters Patent is hereby corrected as shown below:

In the Claims

In Column 10, Claim 10, Line 50, after "(PP)", please insert --, returning to step a) and unlocking the rotation manipulator once the user releases the mouse button--;

In Column 11, Claim 11, Line 12, after "(PP)", please insert --, returning to step a) and unlocking the rotation manipulator once the user releases the mouse button--;

In Column 12, Claim 12, Line 20, after "(PP)", please insert --, returning to step a) and unlocking the rotation manipulator once the user releases the mouse button--.

Signed and Sealed this
Thirteenth Day of September, 2022

Katherine Kelly Vidal
*Director of the United States Patent and Trademark Office*